(12) United States Patent
Ohuchi et al.

(10) Patent No.: US 6,680,535 B2
(45) Date of Patent: Jan. 20, 2004

(54) SEMICONDUCTOR DEVICE, MANUFACTURING METHOD FOR SEMICONDUCTOR DEVICE AND MOUNTING METHOD FOR THE SAME

(75) Inventors: Shinji Ohuchi, Tokyo (JP); Yasushi Shiraishi, Toyko (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/386,490

(22) Filed: Mar. 13, 2003

(65) Prior Publication Data

US 2003/0173658 A1 Sep. 18, 2003

Related U.S. Application Data

(62) Division of application No. 10/235,494, filed on Sep. 6, 2002, which is a division of application No. 09/460,987, filed on Dec. 15, 1999, now Pat. No. 6,476,501.

(30) Foreign Application Priority Data

Apr. 9, 1999 (JP) ............................................. 11-102599

(51) Int. Cl.$^7$ ............................................... H01L 23/48
(52) U.S. Cl. ....................................... 257/737; 257/684
(58) Field of Search ............................... 257/737, 738, 257/778, 684

(56) References Cited

U.S. PATENT DOCUMENTS 6,060,373 A    5/2000   Saitoh
6,159,837 A    12/2000  Yamaji et al.
6,590,257 B2 * 7/2003   Ohuchi ...................... 257/737
2002/0030258 A1 3/2002  Norio Fukasawa et al.

FOREIGN PATENT DOCUMENTS

JP    5-335411    12/1993
JP    10-79362    3/1998

OTHER PUBLICATIONS

Fig. 3 in Report 1999 International CES, NIKKEI Microdevices, Feb., 1999, p. 43.

* cited by examiner

Primary Examiner—Roy Potter
(74) Attorney, Agent, or Firm—Volentine Francos, PLLC

(57) ABSTRACT

A semiconductor device in accordance with the present invention reduces cracks occurring in a junction between a semiconductor device and a mounting substrate due to a heat stress when the semiconductor device is mounted on a printed circuit board or the like. The semiconductor device has a semiconductor element having a thickness of 200 $\mu$m or less, an electrode pad formed on the semiconductor element, a post electrically connected to the electrode pad, and a sealing resin for sealing a surface where circuitry is formed and the post. Furthermore, a manufacturing method for a semiconductor device in accordance with the present invention includes a step for forming an electrode pad on a main surface of a semiconductor wafer, a step for forming a post to be connected to the electrode pad, a step for resin-sealing the main surface of the semiconductor wafer and the post, a step for forming a groove from a surface of the resin to a predetermined depth of the semiconductor wafer, and a step for polishing a rear surface of the semiconductor wafer to a bottom of the groove and dividing the semiconductor wafer into individual semiconductor devices.

28 Claims, 12 Drawing Sheets

DEVICE THICKNESS VS MAX. DISTORTION &
FATIGUE OF SOLDER BALL

RATIO OF RESIN THICKNESS TO Si THICKNESS VS
MAX. DISTORTION OF SOLDER BALL

SEMICONDUCTOR DEVICE, MANUFACTURING METHOD FOR SEMICONDUCTOR DEVICE AND MOUNTING METHOD FOR THE SAME

CROSS REFERENCE TO RELATED APPLICATIONS

This is a divisional application of application Ser. No. 10/235,494, filed Sep. 6, 2002, which is a divisional application of application Ser. No. 09/460,987, now U.S. Pat. No. 6,476,501, filed Dec. 15, 1999, which are hereby incorporated by reference in their entirety for all purposes.

BACKGROUND OF THE INVENTION

1. Field of the Invention

The present invention relates to a semiconductor device and a manufacturing method for the same and, more particularly, to a package of the semiconductor device.

2. Description of the Related Art

In recent years, with the increasing mounting density of semiconductor devices, chip-size packages or similar types of semiconductor devices are drawing attention.

Hitherto, as such a type of chip-size packages, one shown in FIG. 9 has been available. A semiconductor device shown in FIG. 9 has electrode pads 2 formed on a semiconductor element 1 having a thickness of 400 $\mu$m, and posts 3 composed of copper or the like electrically connected to the electrode pads 2 are formed thereon. The surface of the semiconductor element and the posts 3 are sealed by a resin 4 that is approximately 100 $\mu$m thick. Bumps 5 composed of solder or the like are formed on the posts 3 exposed on a resin surface.

Referring to FIG. 10, a manufacturing method for a conventional semiconductor device will be described.

Posts 101 made of copper or the like are formed on a wafer 100, which is a semiconductor substrate as illustrated in FIG. 10-A. In this state, a resin 102 is charged to cover the entire wafer as illustrated in FIG. 10-B. The entire surface is polished until the posts 101 are exposed on the surface as illustrated in FIG. 10-C. Then, bump electrodes 103 made of solder or the like are formed on the surfaces of the posts 101 as illustrated in FIG. 10-D. Lastly, the wafer is cut and divided into individual semiconductor devices as illustrated in FIG. 10-E.

The conventional structure and manufacturing method have been posing problems including one in which a crack occurs at a junction between a semiconductor element and a mounting substrate due to thermal stress when mounting a semiconductor device on a printed board or the like (refer to FIG. 11). In the manufacturing method for the conventional semiconductor devices, if the stress of a sealing resin is high, then a wafer develops a warp when resin sealing is performed. A warped wafer is difficult to be fixed when dividing it into individual segments as shown in FIG. 12.

SUMMARY OF THE INVENTION

To solve the problems mentioned above, a semiconductor device in accordance with the present invention has a semiconductor element having a thickness of 200 $\mu$m or less, an electrode pad formed on the semiconductor element, a post electrically connected to the electrode pad, and a sealing resin for sealing a surface of the semiconductor element whereon circuitry is formed and the post.

Furthermore, a manufacturing method for a semiconductor device in accordance with the present invention includes a step for forming an electrode pad on a main surface of a semiconductor wafer, a step for forming a post to be electrically connected to the electrode pad, a step for resin-sealing the main surface of the semiconductor wafer and the post, a step for forming a groove from a resin surface to a predetermined depth of the semiconductor wafer, and a step for polishing a rear surface of the semiconductor wafer to a bottom of the groove and dividing the semiconductor wafer into individual semiconductor devices.

A mounting method for a semiconductor device in accordance with the present invention includes a step for preparing a semiconductor device in which a main surface of a semiconductor element having a thickness of 200 $\mu$m or less has been resin-sealed, a step for disposing the semiconductor device on a mounting substrate, and a step for connecting the semiconductor device and the mounting substrate by heat treatment.

DESCRIPTION OF THE PREFERRED EMBODIMENT (First Embodiment)

Figure 1:
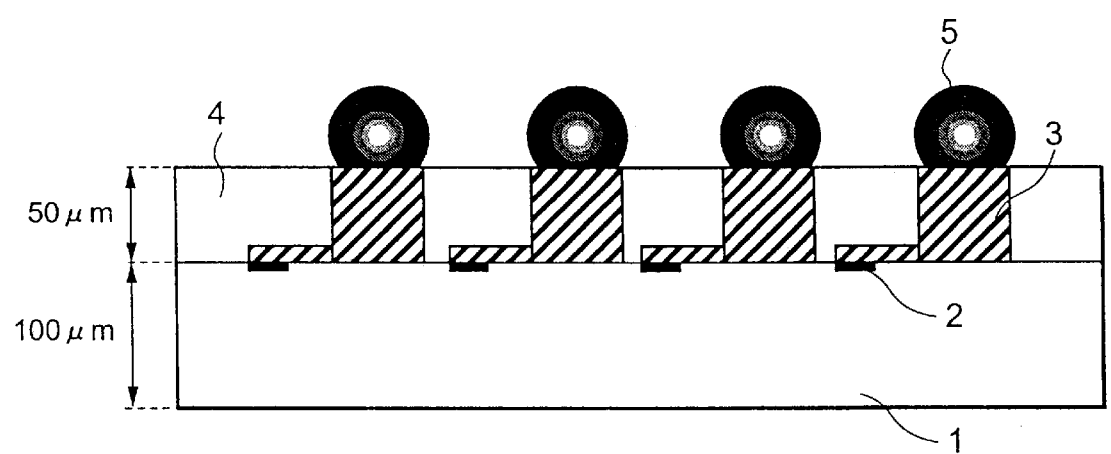
FIG. 1 is a diagram showing a structure of a semiconductor device of a first embodiment in accordance with the present invention.
Figure 8:
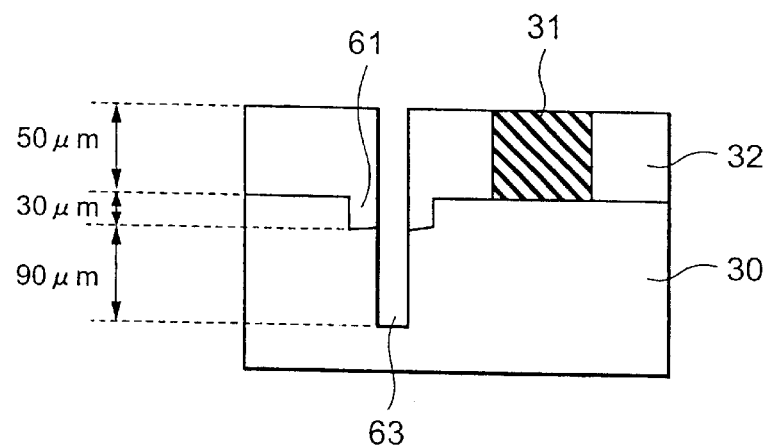
FIG. 8 is an enlarged view of a groove in the manufacturing method for the semiconductor device of the second embodiment in accordance with the present invention.
Figure 9:
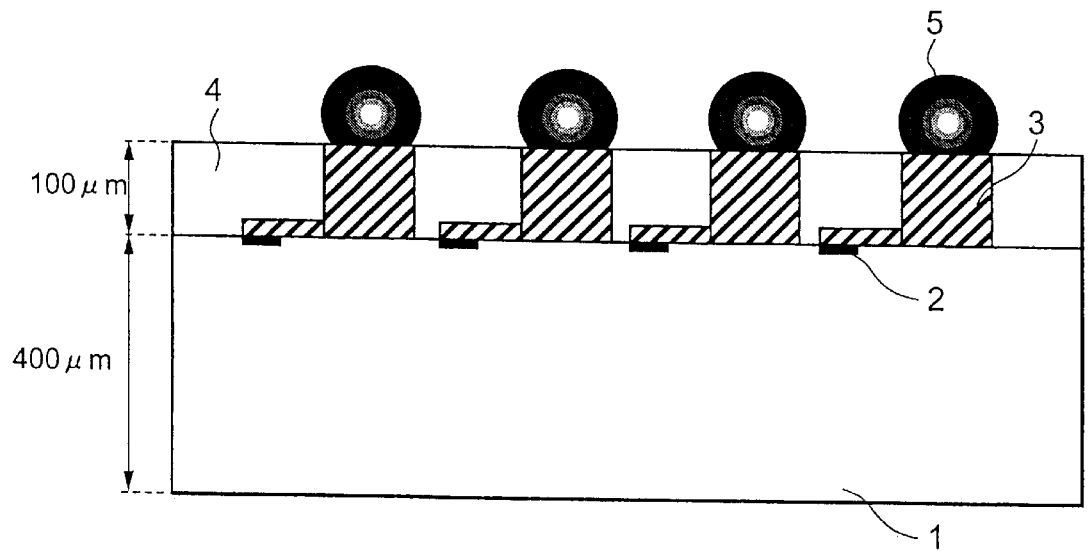
FIG. 9 is a diagram showing a structure of a conventional semiconductor element.
Figure 10A:
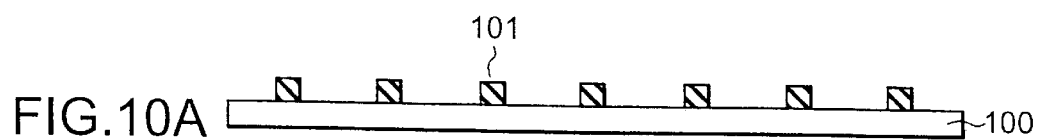
FIG. 10 is a process diagram showing steps of a manufacturing method for a conventional semiconductor element.
Figure 10B:
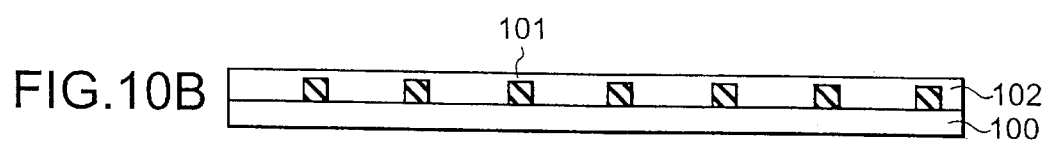
Figure 10C:
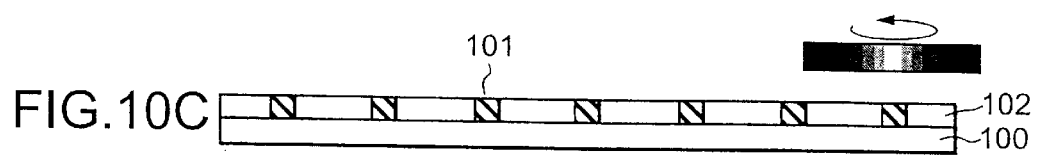
Figure 10D:
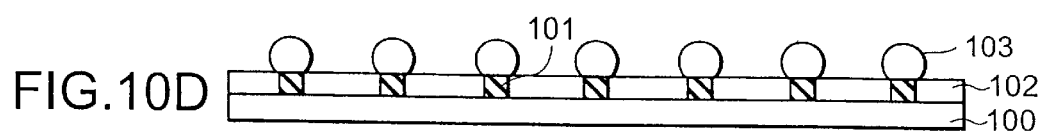
Figure 10E:
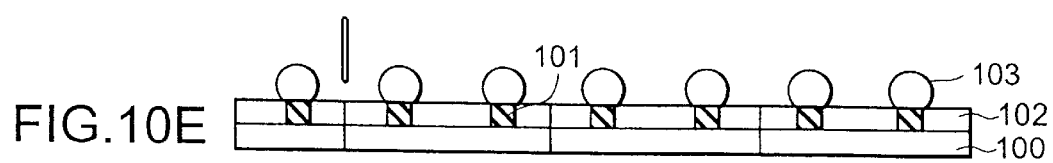
Figure 11:
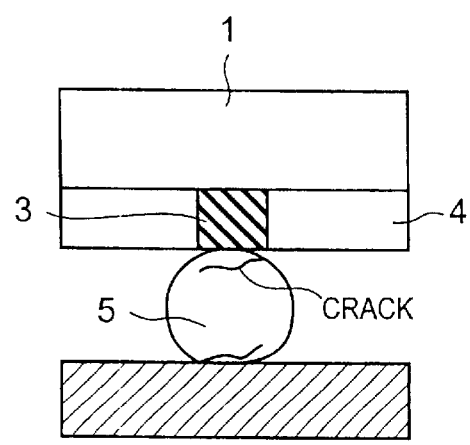
FIG. 11 and FIG. 12 are diagrams showing problems with a conventional art.
Figure 12:
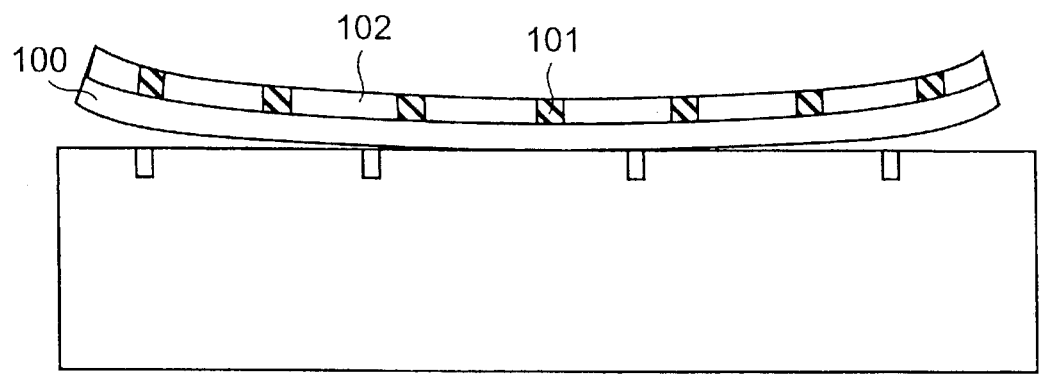
Figure 13A:
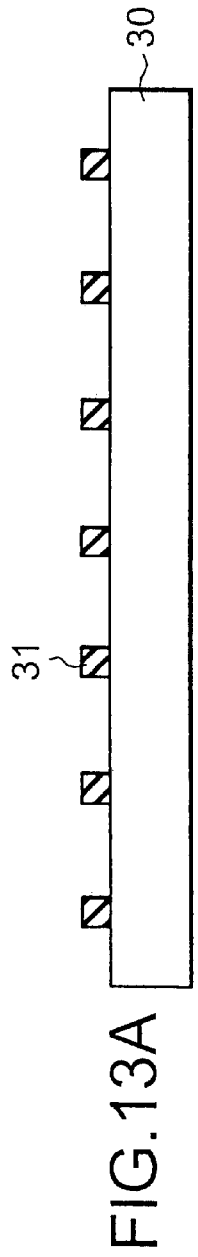
FIG. 13 and FIG. 14 are process diagrams showing steps of a manufacturing method for a semiconductor device of a third embodiment in accordance with the present invention.
Figure 13B:
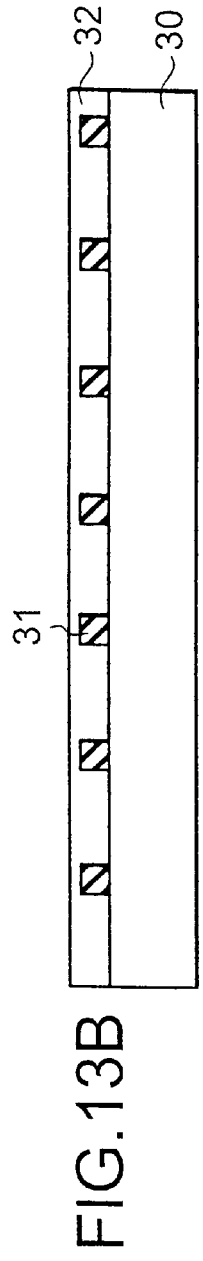
Figure 13C:
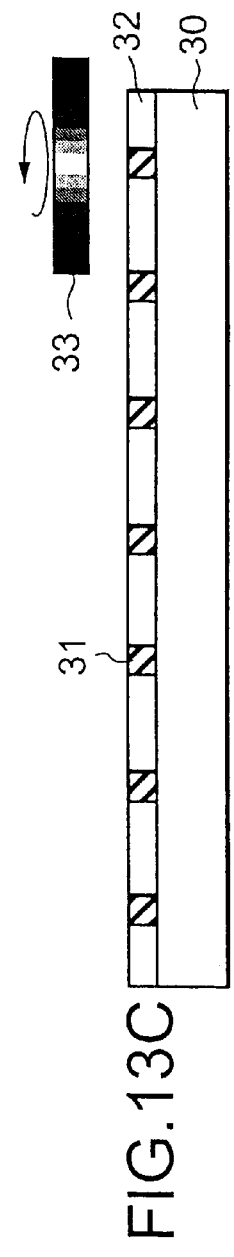
Figure 13D:
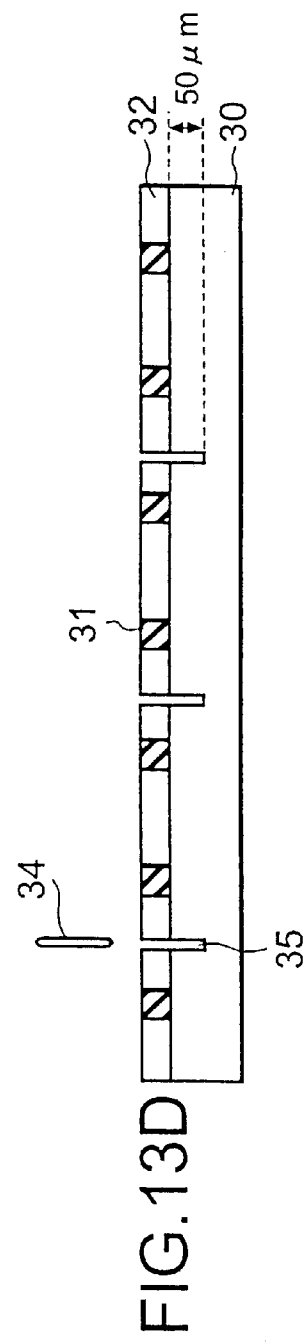

FIG. 1 is a diagram showing a structure of a semiconductor device in a first embodiment according to the present invention. In conjunction with FIG. 1, the first embodiment of the invention will be described. The same components as those in FIG. 8 will be assigned the same reference numerals, and descriptions will be given thereof. In the drawings, a thickness of a semiconductor element or a resin will be indicated by dashed lines or the like.

A semiconductor element 1 is formed to be thinner than 400 $\mu$m, which is a thickness in a conventional structure. In this embodiment, the semiconductor element 1 is 100 $\mu$m thick.

Aluminum electrode pads 2 are formed at predetermined locations on a main surface of the semiconductor element 1.

Posts 3 composed of copper are formed on the semiconductor element, the height of the posts 3 being 50 μm. The posts 3 are electrically connected to the aluminum electrode pads 2.

The main surface (a surface where a circuit is formed) of the semiconductor element 1 and the posts 3 are sealed by a resin 4, the thickness of the resin 4 being 50 μm, which is identical to the thickness of the posts 3. Bump electrodes 5 are formed on the resin 4. In this embodiment, the bump electrodes 5 composed of solder or the like are formed on the posts 3 exposed on the surface of the resin 4.

Figure 2A:
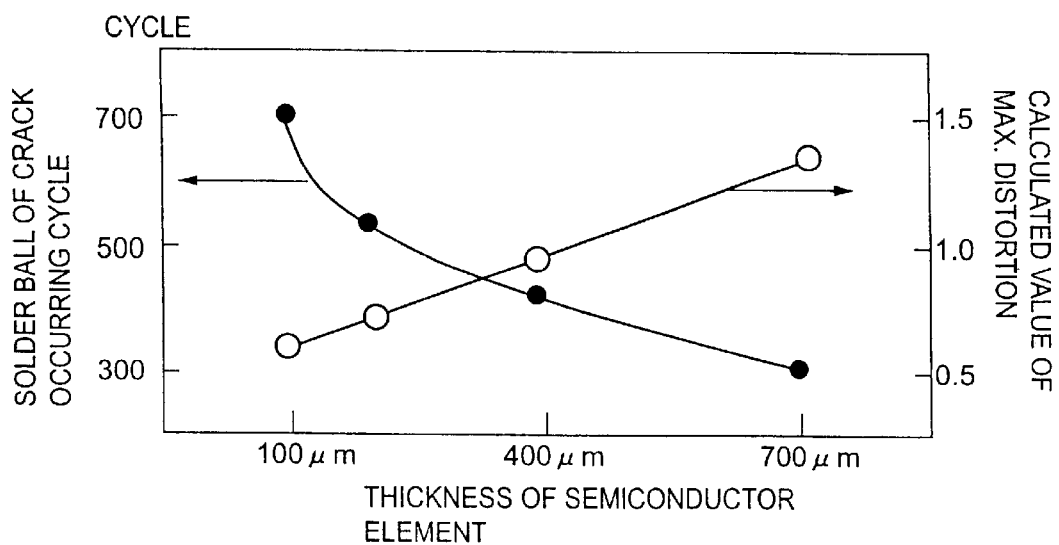
FIG. 2 is a diagram showing a temperature cycle characteristic of a semiconductor device in accordance with the present invention.
Figure 2B:
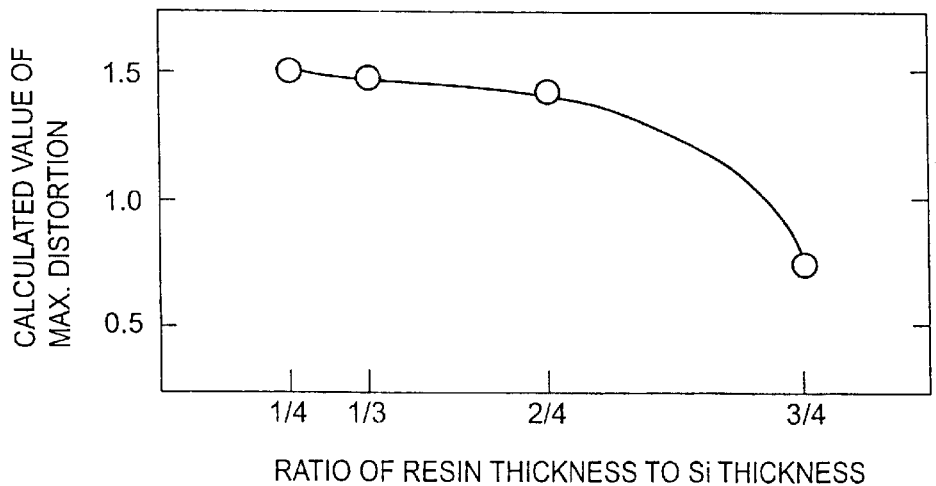
Figure 3A:
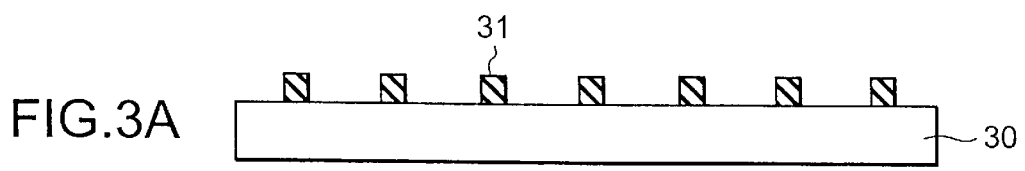
FIG. 3 and FIG. 4 are process diagrams showing steps of a manufacturing method for the semiconductor device of the first embodiment in accordance with the present invention.
Figure 3B:
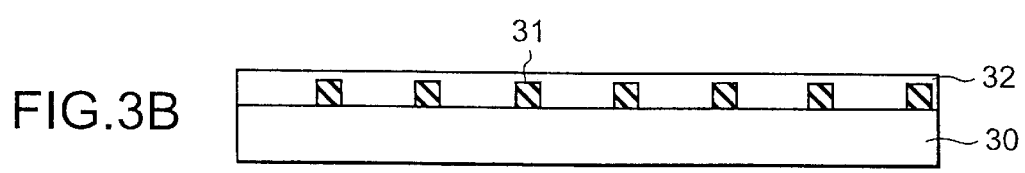
Figure 3C:
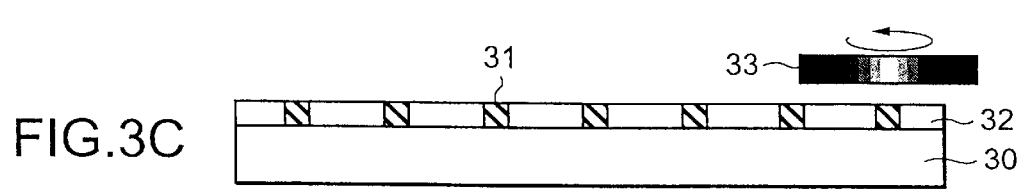
Figure 3D:
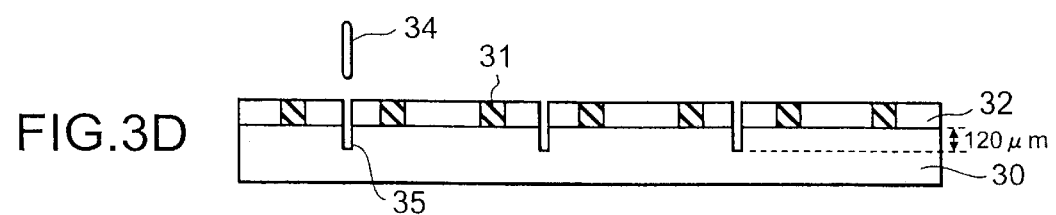

FIG. 2-A is a diagram showing results of a temperature cycle test conducted with a semiconductor device mounted on a mounting substrate such as a printed circuit board. In FIG. 2-A, the axis of abscissa indicates the thickness of a semiconductor element, while the axis of ordinates indicates the number of cycles at which a crack occurs in a junction (a solder ball in this embodiment) between the semiconductor device and the mounting substrate in relation to a distortion observed between the mounting substrate and the semiconductor device.

Due to a difference in thermal expansion coefficient, a distortion takes place between the semiconductor device and the mounting substrate. Decreasing the thickness of the semiconductor element 1 adds to the flexibility of the semiconductor element itself; hence, the semiconductor element itself will absorb the distortion during heating. FIG. 2-A shows that the maximum distortion of a junction decreases as the thickness of the semiconductor element is decreased.

Furthermore, as the semiconductor element is made thinner, the number of temperature cycles at which a crack appears in the solder ball increases.

The effect is remarkably noticeable when the thickness of the semiconductor element is reduced to 200 μm or less.

FIG. 2-B shows temperature characteristics observed when the thickness of the resin sealing the main surface of the semiconductor element is changed, with the thickness of the semiconductor element being left unchanged. Data shown in FIG. 2-B has been obtained when the thickness of the semiconductor element was set to 200 μm, and the thickness of the resin was changed to about 50 μm, about 60 μm, about 100 μm, and about 150 μm, respectively.

As compared with a case wherein the ratio of the thickness of the semiconductor element to the thickness of the resin is set to 4 to 1, the maximum distortion is reduced when the ratio of the thickness of the semiconductor element to the thickness of the resin is set to 2 to 1, or 1 to 1 as in the case of the present invention. This indicates that the flexibility of the semiconductor element itself increases with resultant better temperature characteristics when the thickness of the resin is greater than the thickness of the semiconductor element. Marked effect can be observed when the thickness of the resin is set to a half or more of the thickness of the semiconductor element.

More detailed experiments and simulations carried out by the inventors have revealed that, in the semiconductor device in accordance with the present invention, cracks that occur primarily when mounting the semiconductor device on a substrate can be sufficiently restrained by setting the thickness of the semiconductor element to 200 μm or less and by setting the thickness of the resin to a half or more of the thickness of the semiconductor element.

Figure 4A:
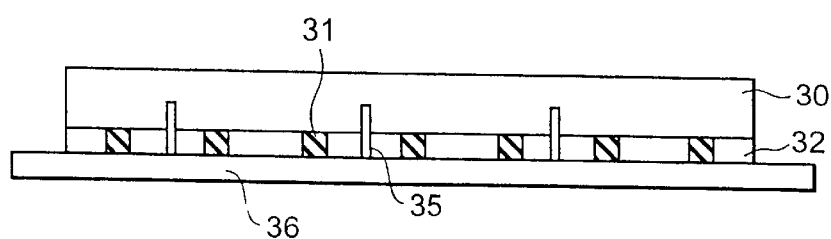
Figure 4B:
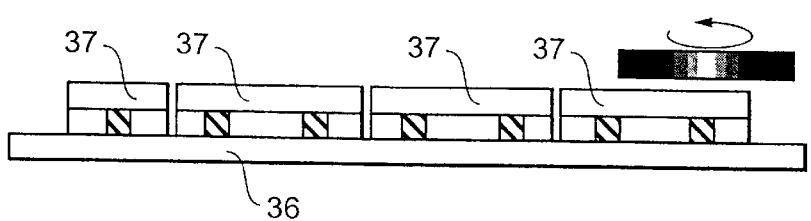
Figure 4C:
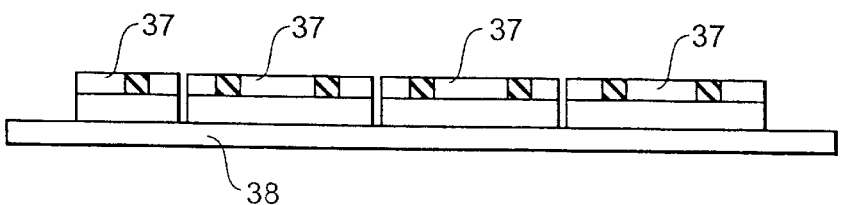

FIG. 3 and FIG. 4 illustrate a manufacturing method for a semiconductor device of the first embodiment in accordance with the invention.

Referring to FIG. 3 and FIG. 4, the manufacturing method for a semiconductor device of the first embodiment in accordance with the invention will be described.

Copper posts 31 having a height of approximately 50 μm are formed on a main surface (where a circuit is formed) of a semiconductor wafer 30 by electroplating or the like as shown in FIG. 3-A. The posts 31 are electrically connected to electrode pads (not shown) formed on the wafer 30.

A resin 32 is charged according to a transfer molding method, a potting method, a printing method, etc. to cover the main surface of the semiconductor wafer 30 and the posts 31 (see FIG. 3-B).

The semiconductor wafer 30 at this stage has a sufficient thickness to prevent a warp from taking place due to stress of the resin 32, etc.

The surface of the resin 32 is polished by a polishing blade 33 until the posts 31 buried in the resin 32 are exposed and the heights of the resin 32 and the posts 31 reach 50 μm (see FIG. 3-C).

Grooves 35 are formed in the surface covered with the resin 32 by an outer peripheral blade 34 that rotates at a high speed, the grooves 35 being formed at locations where the wafer is divided into individual semiconductor devices later. The depth of the grooves 35 is determined on the basis of a thickness of the semiconductor elements in the final individual semiconductor devices. In this embodiment, the thickness of the semiconductor element 1 is set to 100 μm, so that the grooves having a depth of 120 μm are formed in the semiconductor wafer 30. The depth from the resin surface to the bottoms of the grooves 35 formed in this process step will be a sum of the resin thickness and the depth of the grooves in the wafer, namely, 50+120=170 μm (see FIG. 3-D).

Then, a grinding tape 36 is attached to the surface of the substrate whereon the resin has been deposited. The grinding tape can be easily peeled off by radiating ultraviolet rays thereby to weaken its adhesive strength.

The surface to which the grinding tape 36 has been attached is fixed onto a grinding stage (not shown) as shown in FIG. 4-A. Then, the entire rear surface of the wafer 30 is polished with the wafer 30 secured to the grinding stage until the bottoms of the grooves 35, which have been formed in the preceding step, are reached.

Polishing the rear surface of the wafer 30 until the bottoms are reached causes the wafer 30 to be divided into individual semiconductor devices. Thus, the separated semiconductor devices 37 from the wafer are arranged on the grinding tape 36 as shown in FIG. 4-B.

A mounting tape 38 is attached to the rear surface, which has been polished, before the semiconductor devices 37 are moved to the following step wherein bump electrodes or the like are formed as necessary.

In the manufacturing method in this embodiment, the wafer is first sealed with the sufficiently thick resin, so that there should be no danger of a warp occurring in wafer at this stage. Thereafter, the grooves are formed in the wafer from the resin side, then the entire rear surface of the wafer is polished to the bottoms of the grooves thereby to divide the wafer into separate semiconductor devices.

The method described above makes it possible to solve the warp problem with a wafer when fixing the wafer.

Even when the semiconductor element finally becomes thin, the individual semiconductor devices are sufficiently smaller than the wafer, thus solving the stress problem attributable to a resin. The manufacturing method in accordance with the present invention also makes it possible to provide a semiconductor device having a thinner semiconductor element than a conventional semiconductor element.

(Second Embodiment)

Figure 5:
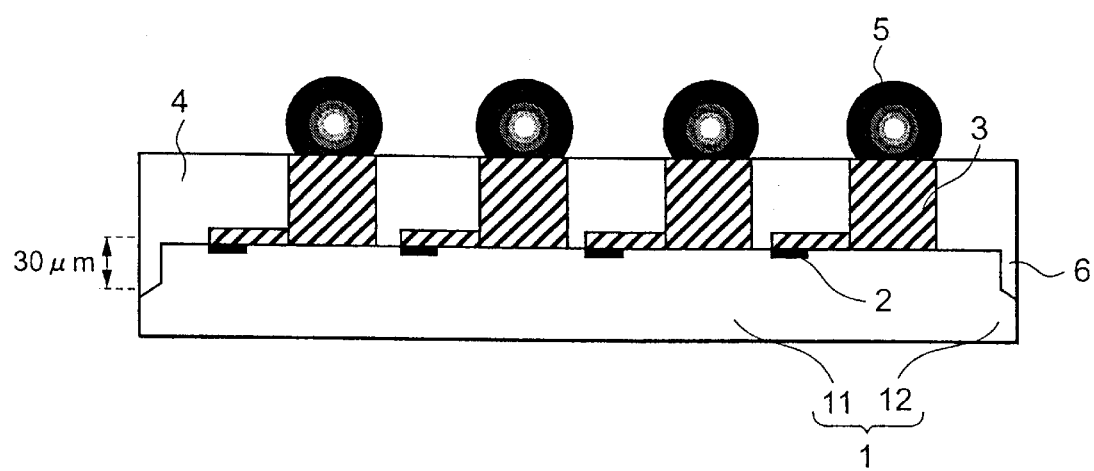
FIG. 5 is a diagram showing a structure of a semiconductor device of a second embodiment in accordance with the present invention.
Figure 6A:
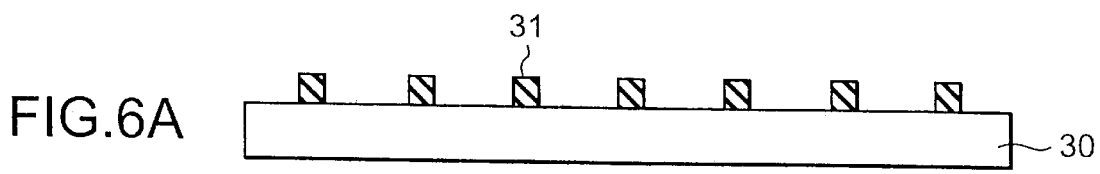
FIG. 6 and FIG. 7 are process diagrams showing steps of a manufacturing method for the semiconductor device of the second embodiment in accordance with the present invention.
Figure 6B:
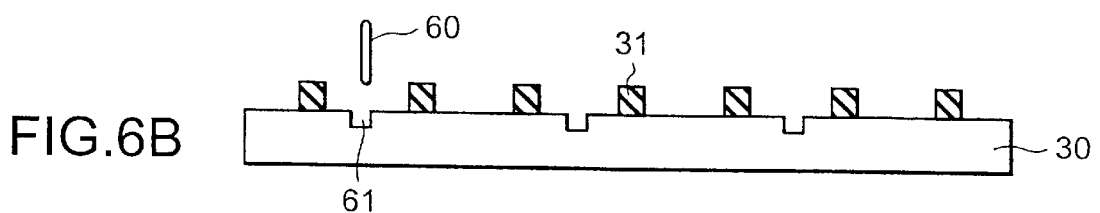
Figure 6C:
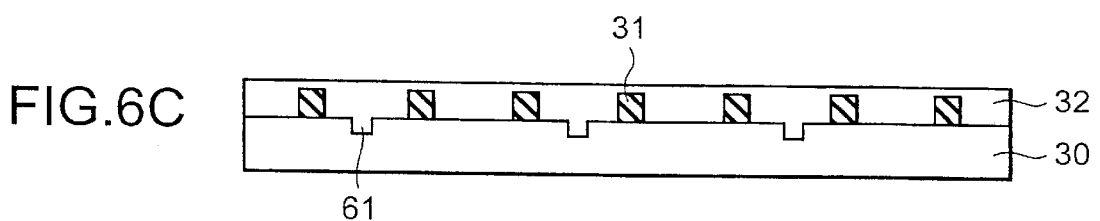
Figure 6D:
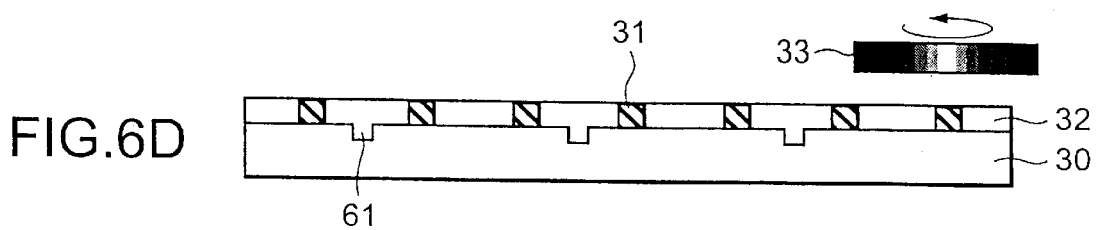
Figure 7A:
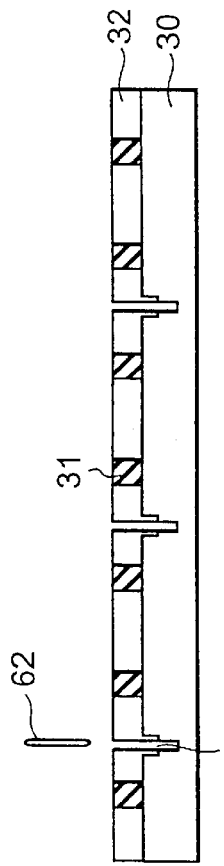
Figure 7B:
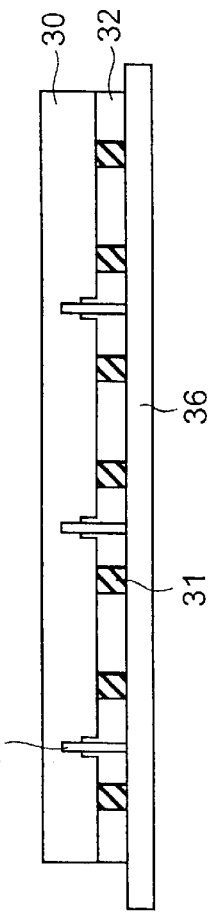
Figure 7C:
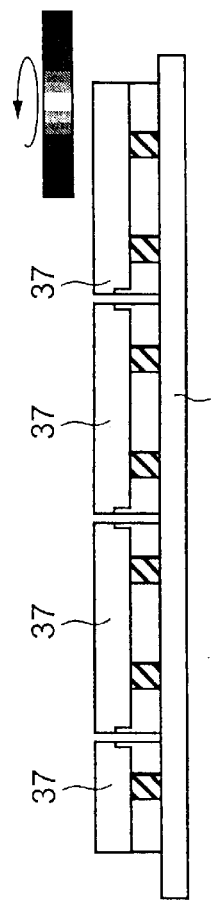
Figure 7D:
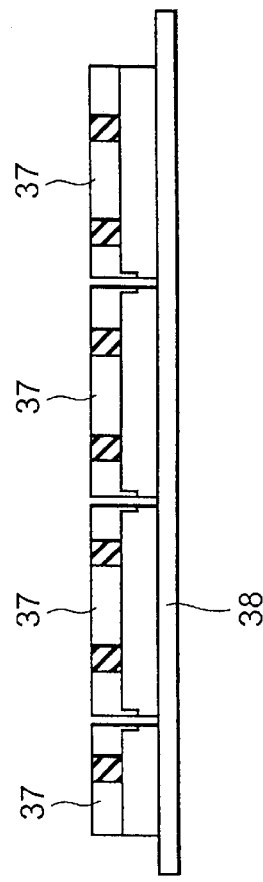

FIG. 5 shows a structure of a semiconductor device in a second embodiment in accordance with the present invention.

Referring to FIG. 5, the second embodiment will now be described. In the description, like components as those in FIG. 1 will be assigned like reference numerals.

A semiconductor element 1 is formed to be thinner than a conventional structure that measures 400 μm. A central portion 11 of the semiconductor element 1 in this embodiment is 100 μm thick. The thickness of the semiconductor device 1 is smaller in a peripheral portion 12 thereof than in the central portion 11 thereof, meaning that the peripheral portion of the semiconductor element 1 has a stepped portion 6. The stepped portion 6 is formed on a main surface side (the surface where circuitry is formed) of the semiconductor element. A depth of the stepped portion 6, i.e. a distance from the surface of the central portion to the top of the peripheral portion 12, is approximately 30 μm.

Aluminum electrode pads 2 are formed at predetermined locations on the main surface portion of the semiconductor element 1, and copper posts 3 are also formed on the semiconductor element 1, the height of the posts 3 being 50 μm. The posts 3 are electrically connected to the aluminum electrode pads 2.

The main surface of the semiconductor element 1 and the posts 3 are sealed by a resin 4 which has a thickness of 50 μm, which is identical to the height of the posts 3. Bump electrodes 5 are formed on the resin 4. In this embodiment, the bump electrodes 5 composed of solder or the like are formed on the posts 3 exposed on the surface of the resin 4.

In the semiconductor device according to the present invention, the peripheral portion 12 of the semiconductor element 1 is thinner than the central portion 11, forming the stepped portion 6. The stepped portion 6 is formed on each of four sides to surround the central portion 11 of the semiconductor element. This arrangement prevents cracks or the like during mounting as in the case of the first embodiment.

The presence of the stepped portion adds to a portion of contact between the resin 4 and the semiconductor element 1 at the peripheral portion 12 of the semiconductor element 1, thus minimizing the chances of peeling off of the resin. Moreover, even if water enters through an interface between the semiconductor element 1 and the resin, the water will not reach the central portion where circuitry is formed.

FIG. 6 and FIG. 7 illustrate a manufacturing method for a semiconductor device according to the second embodiment of the invention.

Referring to FIG. 6 and FIG. 7, the manufacturing method for the semiconductor device according to the second embodiment of the invention will be described. In the description, like components as those in FIG. 3 and FIG. 4 will be assigned like reference numerals.

Copper posts 31 having a height of approximately 50 μm are formed on the main surface of a semiconductor wafer 30 by electroplating or the like (see FIG. 6-A). The posts 31 are electrically connected to electrode pads (not shown) formed on the wafer 30.

First grooves 61 are formed in the main surface of the semiconductor wafer 30 by an outer peripheral blade 60 that are rotated at a high speed. The first grooves 61 are formed in portions that provide the peripheral portions of individual semiconductor elements. The thickness of the blade 60 used for forming the first grooves is approximately 50 μm. The grooves 61 are formed to have a width that is 1 to 5 μm larger than the blade thickness. The depth of the first grooves 61 is 30 μm (see FIG. 6-B).

The main surface, where circuitry is formed, of the semiconductor wafer 30 is filled with a resin 32 by a transfer molding method, a potting method, a printing method, etc. (see FIG. 6-C).

The semiconductor wafer 30 in this step is sufficiently thick, so that it does not develop a warp caused primarily by stress of the resin 32.

The surface of the resin 32 is polished by a polishing blade 33 until the posts 31, which have been buried in the resin, are exposed, and the heights of the resin 32 and the posts 31 reach 50 μm (see FIG. 6-D).

Second grooves 63 are formed using an outer peripheral blade 62, which rotates at a high speed, in the surface covered with the resin 32 as illustrated in FIG. 7-A. The second grooves 63 having a width smaller than that of the first grooves 61 are formed in the first grooves 61, an enlarged view thereof being given in FIG. 8. The thickness of the blade 62 for forming the second grooves 63 is approximately 30 μm.

The depth of the second grooves 63 is determined on the basis of a thickness of the semiconductor elements in the final individual semiconductor devices. In this embodiment, the thickness of central portions of the semiconductor elements is set to 100 μm, so that the grooves having a depth of 120 μm measured from the main surface of the semiconductor wafer 30 are formed in the semiconductor wafer 30. The depth from the resin surface to the bottoms of the second grooves 63 is a sum of the resin thickness, the depth of the first grooves, and the depth of the grooves in the wafer, namely, 50+30+90=170 μm.

Then, a grinding tape 36 is attached to the surface whereon the resin has been deposited. The grinding tape 36 can be easily peeled off by radiating ultraviolet rays thereby to weaken its adhesive strength.

The grinding tape 36 is fixed onto a grinding stage (not shown) as shown in FIG. 7-B. Then, the rear surface of the wafer 30 is polished with the wafer 30 secured to the grinding stage until the bottoms of the second grooves 63, which have been formed in the preceding step, are reached (see FIG. 7-C).

Polishing the rear surface of the wafer until the bottoms of the second grooves 63 are reached causes the wafer 30 to be divided into individual semiconductor devices. In other words, separated semiconductor devices 37 are arranged on the grinding tape 36.

Thereafter, a mounting tape 38 is attached to the polished rear surface of the wafer before the semiconductor devices 37 are supplied to the following step.

In this embodiment, the depth of the first grooves is set to 30 μm. Forming the first grooves 61 to be excessively deep would add to influences of resin stress. Experiments performed by the inventors have revealed that, if the depth of the first grooves is set to exceed 30 μm, then a wafer incurs influences exerted by the resin stress, resulting in a likelihood of a warp when the wafer is fixed. Preferably, the first grooves 61 are formed so that they are deeper than the portion of the wafer surface where circuitry is formed, namely, in a range of about 10 μm to about 30 μm.

The method described above makes it possible to solve the warp problem with a wafer when fixing the wafer.

According to the manufacturing method in this embodiment, a wafer is unlikely to incur a warp or the like when it is fixed, as in the case of the manufacturing method for a semiconductor device according to the first embodiment.

Moreover, forming the first grooves makes it possible to provide a semiconductor device that minimizes chances for a resin to peel off and that is capable of preventing the entry of water.

(Third Embodiment)

Figure 14A:
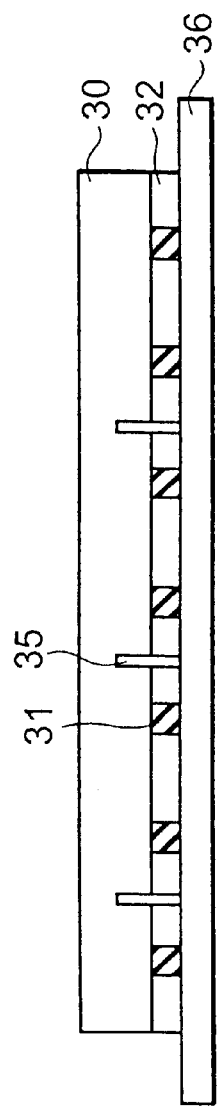
Figure 14B:
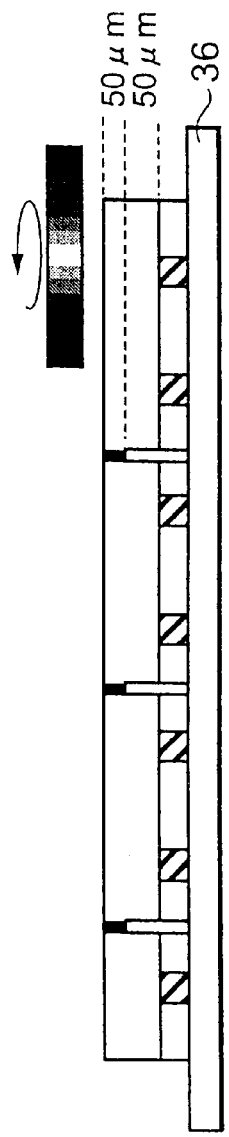
Figure 14C:
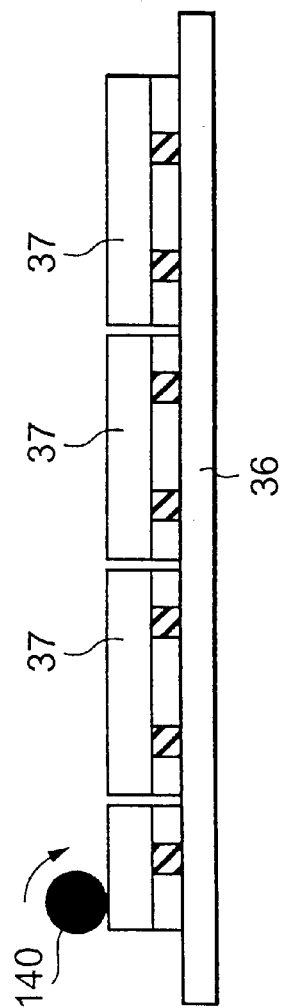

FIG. 13 and FIG. 14 illustrate another manufacturing method for a semiconductor device in accordance with the present invention. The following will describe the manufacturing method according to the invention, taking the first embodiment as an example. In the description, like components as those in FIG. 3 and FIG. 4 will be assigned like reference numerals.

The process up to the step wherein the resin 32 on the semiconductor wafer 30 is polished by the polishing blade 33 is the same as that of the first embodiment (FIG. 13-A through FIG. 13-C).

Thereafter, grooves 35 are formed using an outer peripheral blade 34, which rotates at a high speed, in a surface covered with a resin 32. The grooves 35 are formed at locations where the wafer is divided into individual semiconductor devices.

The third embodiment differs from the first embodiment in the depth of the grooves. In this embodiment, the thickness of a semiconductor element 1 is set to 100 µm, so that the grooves having a depth of 50 µm are formed in the semiconductor wafer 30. Hence, the depth from a resin surface to bottoms of the grooves 35 formed in the step is a sum of the thickness of the resin and the depth of grooves in the wafer, namely, 50+50=100 µm (see FIG. 13-D).

After that, a grinding tape 36 is attached to the surface of a substrate whereon the resin has been deposited. The grinding tape can be easily peeled off by radiating ultraviolet rays thereby to weaken its adhesive strength. The surface to which the-grinding tape 36 has been attached is fixed onto a grinding stage (not shown) as shown in FIG. 14-A. Then, the entire rear surface of the wafer 30 is polished with the wafer 30 secured to the grinding stage until a level which is 50 µm above the bottoms of the grooves 35 is reached. In other words, the polishing is finished when the thickness of the semiconductor wafer 30 reaches 100 µm. At this stage, portions where the grooves 35 have been formed develop cracks that reach the rear surface of the semiconductor wafer 30 primarily due to stress during the polishing (see FIG. 14-B). Thus, the semiconductor devices are divided into individual pieces.

To securely divide the wafer into the semiconductor devices, it is recommended to subject the rear surface of the wafer to processing by a roller 140 or the like. As the roller 140 rolls, portions of the wafer where the grooves 35 have been formed are broken, allowing the wafer to be securely divided into individual semiconductor devices. The steps thereafter are identical to those of the manufacturing method according to the first embodiment.

The same manufacturing method as that of the third embodiment can be implemented in the manufacturing method according to the second embodiment by setting the depth of the second grooves to 100 µm.

According to the manufacturing method in the third embodiment, grooves formed from the main surface side of a semiconductor wafer can be made shorter, thus permitting reduced stress applied to individual semiconductor devices.

The semiconductor devices of the first and second embodiments in accordance with the present invention are disposed on a mounting substrate such as a printed circuit board, and after that, they are connected onto a mounting substrate by heat treatment such as reflow of solder. Using the semiconductor device in accordance with the present invention permits a mounting method that reduces cracks in a junction between a mounting substrate and a semiconductor device.

As described in detail above, a semiconductor device in accordance with the present invention makes it possible to reduce cracks in a junction between a mounting substrate and a semiconductor device.

A manufacturing method in accordance with the present invention makes it possible to solve problems such as a warp of a wafer when the wafer is fixed what

What is claimed is:

1. A semiconductor device comprising:
    a semiconductor element having a thickness of 200 µm or less, said semiconductor element having a first surface, a second surface, and a side surface positioned between the first and second surfaces;
    an electrode pad formed on said semiconductor element;
    a post electrically connected to said electrode pad; and
    a sealing resin for sealing the first surface of said semiconductor element whereon circuitry is formed and said post,
    whereby the second and side surfaces are exposed.

2. The semiconductor device according to claim 1, wherein a thickness of said sealing resin is greater than half the thickness of said semiconductor element.

3. The semiconductor device according to claim 1, wherein said semiconductor element has a central portion that has a first thickness and a peripheral portion that has a second thickness that is smaller than the first thickness.

4. The semiconductor device according to claim 3, wherein a thickness of said sealing resin is greater than half the first thickness of the central portion of said semiconductor element.

5. A semiconductor device comprising:
    a semiconductor element having a thickness of 200 µm or less, said semiconductor element having a first surface whereon circuitry is formed, a second surface, and a side surface positioned between the first and second surfaces;
    an electrode pad formed on the first surface of said semiconductor element;
    a conductive portion electrically connected to said electrode pad; and
    a sealing resin sealing the first surface of said semiconductor element,
    wherein parts of said conductive portion are exposed at a first surface of said sealing resin, wherein the second surface of said semiconductor element is in parallel with the parts of said conductive portion exposed at the first surface of said sealing resin, and wherein said sealing resin has a thickness greater than half the thickness of said semiconductor element,
    wherein the second and side surfaces are not sealed by said sealing resin.

6. The semiconductor device according to claim 5, wherein the thickness of said sealing resin is equal to or smaller than the thickness of said semiconductor element.

7. The semiconductor device according to claim 6, wherein said semiconductor element has a central portion that has a first thickness and a peripheral portion that has a second thickness that is smaller than the first thickness.

8. The semiconductor device according to claim 7, wherein a depth of the peripheral portion is smaller than the thickness of said sealing resin.

9. The semiconductor device according to claim 7, wherein a depth of the peripheral portion is not less than 10 µm, and not more than 30 µm.

10. The semiconductor device according to claim 5, wherein said semiconductor element has a central portion that has a first thickness and a peripheral portion that has a second thickness that is smaller than the first thickness.

11. The semiconductor device according to claim 10, wherein a depth of the peripheral portion is smaller than the thickness of said sealing resin.

12. The semiconductor device according to claim 10, wherein a depth of the peripheral portion is not less than 10 μm, and not more than 30 μm.

13. The semiconductor device according to claim 5, wherein said conductive portion has a first portion which is electrically connected to said electrode pad, and wherein a top surface of the first portion is exposed from said sealing resin.

14. The semiconductor device according to claim 13, wherein said conductive portion has a second portion which is connected between said electrode pad and the first portion, wherein the second portion is positioned along the first surface of said semiconductor element.

15. The semiconductor device according to claim 14, wherein said conductive portion has a bump which is formed on the top surface of the first portion.

16. The semiconductor device according to claim 13, wherein said conductive portion has a bump which is formed on the top surface of the first portion.

17. A semiconductor device comprising:

a semiconductor element having a thickness of 200 μm or less, said semiconductor element having a first surface on which an integrated circuit is formed, a second surface, and a side surface positioned between the first and second surfaces;

an electrode pad formed on the first surface of said semiconductor element;

a conductive portion electrically connected to said electrode pad; and a sealing resin sealing the first surface of said semiconductor element, wherein said sealing resin has a thickness greater than half the thickness of said semiconductor element, wherein the second and side surfaces are exposed.

18. The semiconductor device according to claim 17, wherein the thickness of said sealing resin is equal to or smaller than the thickness of said semiconductor element.

19. The semiconductor device according to claim 18, wherein said semiconductor element has a central portion that has a first thickness and a peripheral portion that has a second thickness that is smaller than the first thickness.

20. The semiconductor device according to claim 19, wherein a depth of the peripheral portion is smaller than the thickness of said sealing resin.

21. The semiconductor device according to claim 19, wherein a depth of the peripheral portion is not less than 10 μm, and not more than 30 μm.

22. The semiconductor device according to claim 17, wherein said semiconductor element has a central portion that has a first thickness and a peripheral portion that has a second thickness that is smaller than the first thickness.

23. The semiconductor device according to claim 22, wherein a depth of the peripheral portion is smaller than the thickness of said sealing resin.

24. The semiconductor device according to claim 22, wherein a depth of the peripheral portion is not less than 10 μm, and not more than 30 μm.

25. The semiconductor device according to claim 17, wherein said conductive portion has a first portion which is electrically connected to said electrode pad, and wherein a top surface of the first portion is exposed from said sealing resin.

26. The semiconductor device according to claim 25, wherein said conductive portion has a second portion which is connected between said electrode pad and the first portion, wherein the second portion is positioned along the first surface of said semiconductor element.

27. The semiconductor device according to claim 26, wherein said conductive portion has a bump which is formed on the top surface of the first portion.

28. The semiconductor device according to claim 25, wherein said conductive portion has a bump which is formed on the top surface of the first portion.

* * * * *